US012677623B2

(12) United States Patent
Lee et al.

(10) Patent No.: US 12,677,623 B2
(45) Date of Patent: Jul. 7, 2026

(54) SUBSTRATE PROCESSING APPARATUS

(71) Applicant: Semes Co., Ltd, Cheonan-si (KR)

(72) Inventors: Sang Min Lee, Seoul (KR); Jong Doo Lee, Cheonan-si (KR); Ju Yeon Song, Sokcho-si (KR)

(73) Assignee: SEMES CO., LTD, Chungcheongnam-Do (KR)

( * ) Notice: Subject to any disclaimer, the term of this patent is extended or adjusted under 35 U.S.C. 154(b) by 69 days.

(21) Appl. No.: 18/672,290

(22) Filed: May 23, 2024

(65) Prior Publication Data

US 2025/0006517 A1 Jan. 2, 2025

(30) Foreign Application Priority Data

Jun. 27, 2023 (KR) ........................ 10-2023-0082876

(51) Int. Cl.
H10P 72/00 (2026.01)
H10P 70/00 (2026.01)
H10P 72/76 (2026.01)

(52) U.S. Cl.
CPC .......... H10P 72/0408 (2026.01); H10P 70/12 (2026.01); H10P 70/80 (2026.01); H10P 72/7618 (2026.01); H10P 72/7624 (2026.01)

(58) Field of Classification Search
CPC ......... H01L 21/67034; H01L 21/02046; H01L 21/02101
See application file for complete search history.

(56) References Cited

U.S. PATENT DOCUMENTS

2016/0204006 A1* 7/2016 Fujii ................ H01L 21/67051
156/345.23

FOREIGN PATENT DOCUMENTS

| KR | 20180045961 A | 5/2018 |
| KR | 20180059640 A | 6/2018 |
| KR | 10-2019-0125678 A | 11/2019 |
| KR | 20210015055 A | 2/2021 |
| KR | 10-2021-0036454 A | 4/2021 |

OTHER PUBLICATIONS

Korean Office Action dated Sep. 19, 2024 issued in corresponding Korean Patent Appln. No. 10-2023-0082876.

* cited by examiner

*Primary Examiner* — Katelyn W Smith
(74) *Attorney, Agent, or Firm* — HARNESS, DICKEY & PIERCE, P.L.C.

(57) ABSTRACT

Disclosed is a manufacturing method of a semiconductor device. The manufacturing method may include: a closing operation of seating a substrate on a support member provided in a chamber, and closing the chamber to seal a treating space provided by the chamber; a clamping operation of clamping the chamber by moving a clamping body in a direction facing the chamber after the closing operation; a close-contact operation of making the chamber be in contact with the clamping body after the clamping operation; and a substrate processing operation of drying the substrate by supplying supercritical fluid into the treating space.

16 Claims, 20 Drawing Sheets

Typical Art

Typical Art

Typical Art

FIG. 5

SUBSTRATE PROCESSING APPARATUS

CROSS-REFERENCE TO RELATED APPLICATIONS

This application claims priority to and the benefit of Korean Patent Application No. 10-2023-00082876 filed in the Korean Intellectual Property Office on Jun. 27, 2023 the entire contents of which are incorporated herein by reference.

TECHNICAL FIELD

The present invention relates to a substrate processing apparatus, a method of controlling a substrate processing apparatus, and a method of manufacturing the same.

BACKGROUND ART

To manufacture a semiconductor device, a desired pattern is formed on a substrate, such as a wafer, through various processes, such as photography, etching, ashing, ion implantation, and thin film deposition. Various processing solutions and processing gas are used in each process, and particles and process by-products are generated during the process. Cleaning processes are performed before and after each process to remove these particles and process by-products from the substrate.

In the cleaning process, the substrate is cleaned by supplying a cleaning solution to the substrate. The substrate is then dried to remove any residual cleaning solution on the substrate. One example of a drying treatment is a rotary drying process in which the substrate is rotated at a high speed to remove any residual cleaning solution on the substrate. However, the rotary drying process that rotates the substrate to remove the cleaning solution has the risk of destroying the pattern formed on the substrate. In addition, as the aspect ratio of the patterns increases, the cleaning fluid introduced between the patterns may not be adequately removed due to the rotation of the substrate.

Recently, a supercritical drying process has been utilized in which the residual cleaning solution on the substrate is replaced with an organic solvent, such as isopropyl alcohol (IPA), which has a low surface tension, and the substrate is then supplied with supercritical drying gas (for example, carbon dioxide) to remove the residual organic solvent from the substrate. In a supercritical drying process, drying gas is supplied into a sealed chamber, and the drying gas is heated and pressurized. Both the temperature and the pressure of the drying gas rise to the critical point or above, and the drying gas undergoes a phase change to the supercritical state.

The drying gas in the supercritical state has high solubility and permeability. In other words, when supercritical drying gas is supplied to the substrate, the drying gas easily penetrates into the patterns on the substrate, and the organic solvent remaining on the substrate is also easily dissolved in the drying gas. Thus, the patterns formed on the substrate and the organic solvent remaining between the patterns may be easily removed.

FIG. 1 is a diagram illustrating an upper chamber and a lower chamber being closed in a typical supercritical drying apparatus, and FIG. 2 is a diagram illustrating a case where a clamping body clamps the chambers of FIG. 1.

Referring to FIGS. 1 and 2, a typical supercritical drying apparatus includes an upper chamber 1, a lower chamber 2, an O-ring 3, and a clamping body 4. The lower chamber 2 is in close contact with the upper chamber 1 during substrate processing. The upper chamber 1 and the lower chamber 2 are combined with each other to form a treating space in which the substrate is processed. Since it is important for the supercritical drying process to keep the drying gas in a supercritical state, the pressure in the chambers 1 and 2 is pressurized and maintained at a high pressure. The clamping body 4 prevents the gap between the upper chamber 1 and the lower chamber 2 from widening excessively while the supercritical drying process is being performed, and reduces the load applied to the driver that moves the lower chamber 2.

In order for the clamping body 4 to move without friction with the chambers 1 and 2 when clamping the chambers 1 and 2, a certain gap needs to exist between the inner surface of the clamping body 4 and the surfaces of the upper and lower chambers 1 and 2. This gap may act as a space in which the upper and lower chambers 1 and 2 are movable when the gap between the upper and lower chambers 1 and 2 is widened. As illustrated in FIG. 3, when a high pressure drying gas is supplied into the chambers 1 and 2, the upper chamber 1 and the lower chamber 2 move in an upward direction and a downward direction, respectively, and collide with the clamping body 4. When the upper and lower chambers 1 and 2 collide with the clamping body 4, particles may be generated within the chambers 1 and 2, and the position of the substrate supported within the chambers 1 and 2 may be distorted, resulting in inadequate drying of the substrate.

SUMMARY OF THE INVENTION

The present invention to solve the foregoing problems provides a substrate processing apparatus capable of efficiently processing a substrate, and a method of controlling the substrate processing apparatus, and a method of manufacturing the same.

Furthermore, the present invention to solve the foregoing problems provides a substrate processing apparatus capable of minimizing generation of particles in a treating space provided by a chamber due to collision between the chamber and a clamping body, and a method of controlling the substrate processing apparatus, and a method of manufacturing the same.

Furthermore, the present invention to solve the foregoing problems provides a substrate processing apparatus capable of minimizing distortion of a position of a substrate even though a treatment fluid is supplied into the chamber, and a method of controlling the substrate processing apparatus, and a method of manufacturing the same.

The object of the present invention is not limited thereto, and other objects not mentioned will be clearly understood by those of ordinary skill in the art from the following description.

An exemplary embodiment of the present invention provides an apparatus for processing a substrate, the apparatus including: a chamber defining a treating space in which a substrate is processed, wherein the chamber includes a first chamber body provided with a support member for supporting the substrate, and a second chamber body that is coupled with the first chamber body to define a treating space in which the substrate is processed; a moving unit for moving any one of the first chamber body and the second chamber body; a clamping body for clamping the chamber; a moving module for moving the clamping body between a clamping position for clamping the chamber and an unclamping position for unclamping the chamber; and a controller configured to control the moving unit and the moving module, in which the controller configured to control the moving unit such that the chamber is in close contact with the clamping body when the first chamber body and the second chamber body are in a closed position for sealing the treating space, and the clamping body is in the clamping position.

According to the exemplary embodiment, the controller may control the moving unit such that between the first chamber body and the second chamber body, the first chamber body is in close contact with the clamping body.

According to the exemplary embodiment, the apparatus may further include a fluid supply unit for supplying a treatment fluid to the treating space, and the controller may further control the fluid supply unit, and control the fluid supply unit to supply the treatment fluid to the treating space after the first chamber body is in close contact with the clamping body.

According to the exemplary embodiment, the apparatus may further include a housing having an interior space in which the chamber is disposed, in which the first chamber body may be fastened to the housing, and a buffer may be installed between the first chamber body and the housing.

According to the exemplary embodiment, the buffer may be configured such that a position of the first chamber body is not changed when the first chamber body and the second chamber body are in close contact with each other, and a position of the first chamber body is changed in a direction close to the housing when the moving unit makes the first chamber body be in contact with the clamping body.

According to the exemplary embodiment, the buffer may include a spring.

According to the exemplary embodiment, the buffer may include: a first magnetic element installed in the housing; and a second magnetic element installed in the first chamber body and facing the first magnetic element, and the first magnetic element and the second magnetic element may have the same polarity as each other so as to generate repulsive force between the first magnetic element and the second magnetic element.

According to the exemplary embodiment, the buffer may include: a first magnetic element installed in the housing; a second magnetic element installed in the first chamber body and facing the first magnetic element; a first current source for supplying current to the first magnetic element; and a second current source for supplying current to the second magnetic element.

According to the exemplary embodiment, the second chamber body may be located below the first chamber body, and the moving unit may be configured to move the second chamber body in an up and down direction.

According to the exemplary embodiment, the second chamber body may be located below the first chamber body, and the moving unit may be configured to move the first chamber body in an up and down direction.

According to the exemplary embodiment, at least one of the moving unit and the moving module may be configured to move the chamber or the clamping body in a magnetic levitation manner.

According to the exemplary embodiment, at least one of the moving unit and the moving module may be configured to include any one selected from an air cylinder, a hydraulic cylinder, and a motor.

According to the exemplary embodiment, the clamping body may have one surface having a shape recessed in a direction away from the chamber such that an edge portion of the chamber in the state where the treating space is sealed is inserted.

Another exemplary embodiment of the present invention provides a method of controlling a substrate processing apparatus including a chamber defining a treating space in which a substrate is processed, wherein the chamber includes a first chamber body provided with a support member for supporting the substrate, and a second chamber body that is coupled with the first chamber body to define a treating space in which the substrate is processed, and clamping body for clamping the chamber, the method including: a closing operation of moving any one of the first chamber body and the second chamber body to seal the treating space; a clamping operation of moving the clamping body to clamp the chamber; a close-contact operation of making at least one of the first chamber body and the second chamber body be in contact with the clamping body; and a substrate processing operation of processing the substrate by supplying treatment fluid into the treating space after the close-contact operation has been performed.

According to the exemplary embodiment, the close-contact operation may include making the first chamber body between the first chamber body and the second chamber body be in contact with the clamping body.

According to the exemplary embodiment, when the substrate processing operation is performed, a pressure in the treating space may be greater than a pressure provided by the moving unit that moves any one of the first chamber body and the second chamber body.

Still another exemplary embodiment of the present invention provides a manufacturing method including: a closing operation of seating a substrate on a support member provided in a chamber, and closing the chamber to seal a treating space provided by the chamber; a clamping operation of clamping the chamber by moving a clamping body in a direction facing the chamber after the closing operation; a close-contact operation of making the chamber be in contact with the clamping body after the clamping operation; and a substrate processing operation of drying the substrate by supplying supercritical fluid into the treating space.

According to the exemplary embodiment, the chamber may include a first chamber body provided with the support member, and a second chamber body coupled with the first chamber body to provide the treating space, and the close-contact operation may include making the first chamber body be in contact with the clamping body.

According to the exemplary embodiment, the supercritical fluid supplied to the substrate processing operation may make the second chamber body be in contact with the clamping body.

According to the exemplary embodiment, the second chamber body may be positioned below the first chamber body, and the close-contact operation may include moving the first chamber body in an upward direction to make the first chamber body be in contact with the clamping body.

According to the exemplary embodiment of the present invention, it is possible to efficiently process a substrate.

Further, according to the exemplary embodiment of the present invention, particles generated in the treating space provided by the chamber due to collision between the chamber and the clamping body may be minimized.

Further, according to the exemplary embodiment of the present invention, it is possible to minimize the misplacement of the substrate even when the treatment fluid is supplied into the chamber.

The effect of the present invention is not limited to the foregoing effects, and those skilled in the art may clearly understand non-mentioned effects from the present specification and the accompanying drawings.

BRIEF DESCRIPTION OF THE DRAWINGS

FIG. 5 is a diagram schematically illustrating an exemplary embodiment of a liquid treating chamber of FIG. 4.

Figure 1:
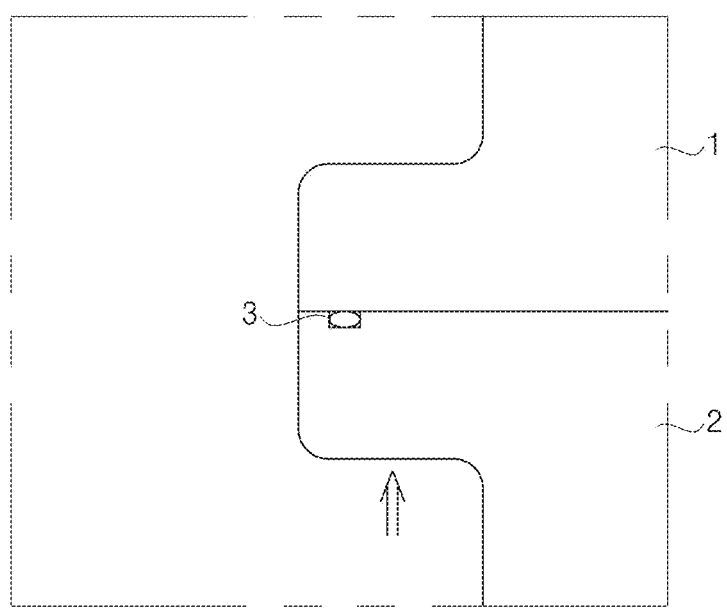
FIG. 1 is a diagram illustrating an upper chamber and a lower chamber being closed in a typical supercritical drying apparatus.
Figure 2:
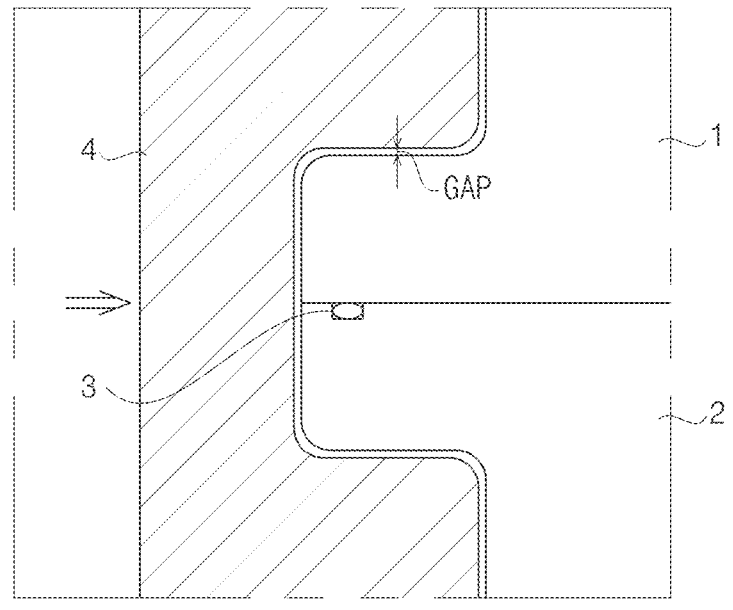
FIG. 2 is a diagram illustrating a clamping body clamping the chamber of FIG. 1.
Figure 3:
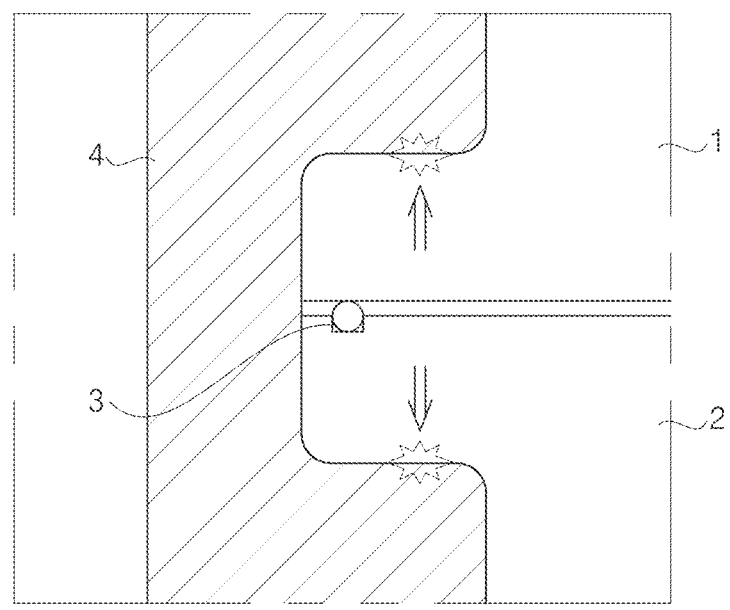
FIG. 3 is a diagram illustrating a situation where a supercritical chamber and the clamping body collide when a supercritical fluid is supplied into the supercritical chamber of FIG. 1.

Various features and advantages of the non-limiting exemplary embodiments of the present specification may become apparent upon review of the detailed description in conjunction with the accompanying drawings. The attached drawings are provided for illustrative purposes only and should not be construed to limit the scope of the claims. The accompanying drawings are not considered to be drawn to scale unless explicitly stated. Various dimensions in the drawing may be exaggerated for clarity.

DETAILED DESCRIPTION

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., +10%).

When the terms "about" or "substantially" are used in connection with a numerical value, it should be understood that the associated numerical value includes a manufacturing or operational tolerance (e.g., +10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described based on a case where a substrate processing apparatus is semiconductor equipment for manufacturing semiconductor devices by processing a substrate W, such as a wafer as an example.

Figure 4:
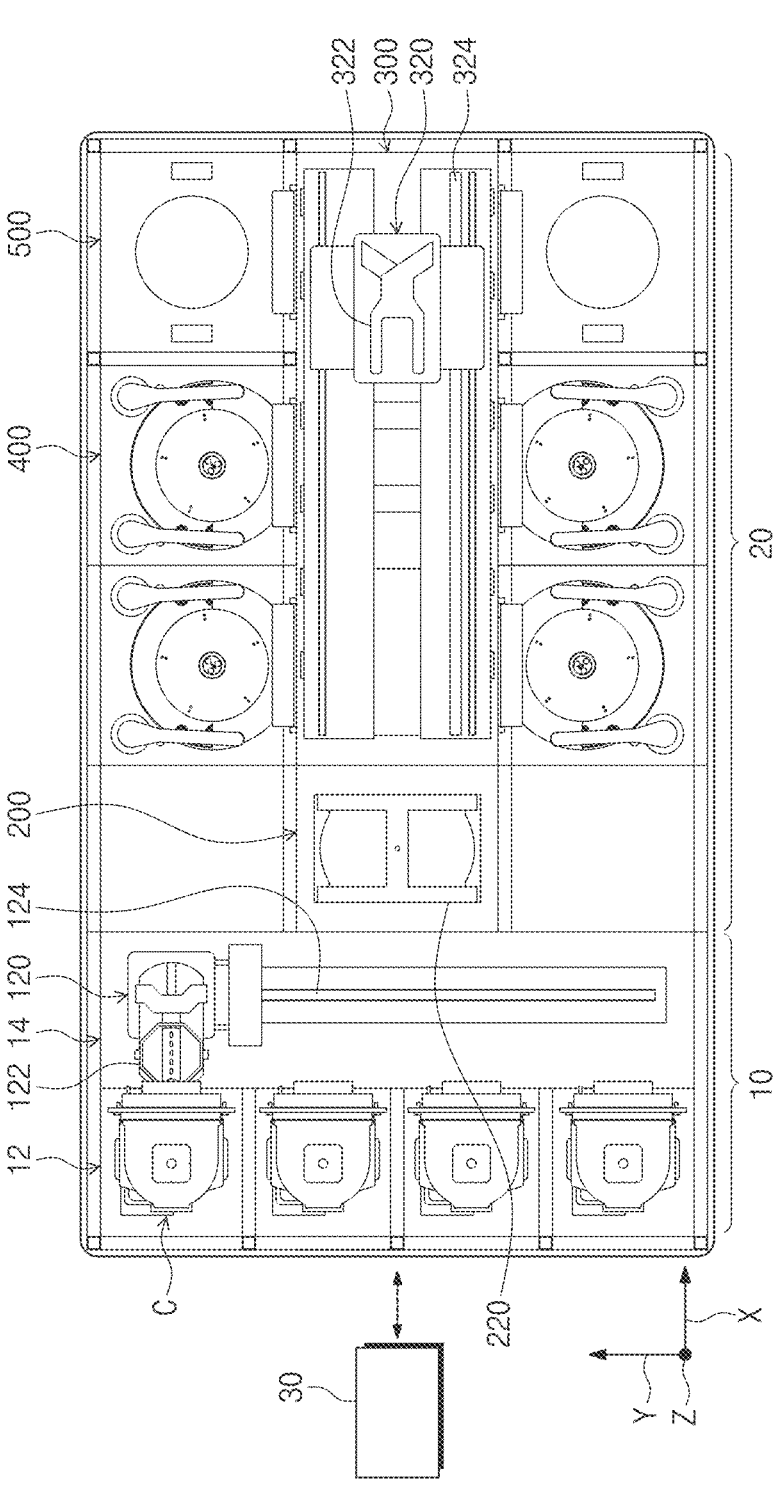
FIG. 4 is a perspective view schematically illustrating a substrate processing apparatus according to an exemplary embodiment of the present invention.

FIG. 4 is a perspective view schematically illustrating a substrate processing apparatus according to an exemplary embodiment of the present invention.

Referring to FIG. 4, a substrate processing apparatus includes an index module 10, a treating module 20, and a controller 30. When viewed from above, the index module 10 and the treating module 20 are disposed along one direction. Hereinafter, the direction in which the index module 10 and the treating module 20 are arranged is referred to as a first direction X, when viewed from above, a direction perpendicular to the first direction X is referred to as a second direction Y, and a direction perpendicular to both the first direction X and the second direction Y is referred to as a third direction Z.

The index module 10 transfers the substrate W from the container C in which the substrate W is accommodated to the treating module 20, and accommodates the substrate W that has been completely treated in the treating module 20 in the container C. A longitudinal direction of the index module 10 is provided in the second direction Y. The index module 10 includes a load port 12 and an index frame 14. Based on the index frame 14, the load port 12 is located at a side opposite to the treating module 20. The container C in which the substrates W are accommodated is placed in the load port 12. A plurality of load ports 12 may be provided, and the plurality of load ports 12 may be disposed along the second direction Y.

As the container C, an airtight container, such as a Front Open Unified Pod (FOUP), may be used. The container C may be placed on the load port 12 by a transport means (not illustrated), such as an overhead transfer, an overhead conveyor, or an automatic guided vehicle, or an operator.

An index robot 120 is provided to the index frame 14. A guide rail 124 of which a longitudinal direction is provided in the second direction Y is provided in the index frame 14, and the index robot 120 may be provided to be movable on the guide rail 124. The index robot 120 includes a hand 122 on which the substrate W is placed, and the hand 122 may be provided to be movable forward and backward directions, rotatable about the third direction Z and movable along the third direction Z. A plurality of hands 322 are provided to be spaced apart in the vertical direction, and the hands 322 may move forward and backward independently of each other.

The treating module 20 includes a buffer unit 200, a transfer chamber 300, a liquid t treatment chamber 400, and a drying chamber 500. The buffer unit 200 provides a space in which the substrate W loaded into the treating module 20 and the substrate W unloaded from the treating module 20 stay temporarily. The liquid treatment chamber 400 performs a liquid treatment process of treating the substrate W with a liquid by supplying a liquid onto the substrate W. The drying chamber 500 performs a drying process of removing the liquid residual on the substrate W. The transfer chamber 300 transfers the substrate W between the buffer unit 200, the liquid treatment chamber 400, and the drying chamber 500.

The buffer unit 200 includes a plurality of buffers 220 on which the substrate W is placed. The buffers 220 may be disposed to be spaced apart from each other along the third direction Z. The buffer 220 may be a substrate holder that supports the bottom surface of the substrate W. The buffer 220 may be provided in the form of a support shelf that supports the bottom surface of the substrate W.

A front face and a rear face of the buffer unit 200 are opened. The front face is a face facing the index module 10, and the rear face is a face facing the transfer chamber 300. The index robot 120 may approach the buffer unit 200 through the front face, and the transfer robot 320 may approach the buffer unit 200 through the rear face.

A longitudinal direction of the transfer chamber 300 may be provided in the first direction X. The buffer unit 200 may be disposed between the index module 10 and the transfer chamber 300. The liquid treatment chamber 400 and the drying chamber 500 may be disposed on the side portion of the transfer chamber 300. The liquid treatment chamber 400 and the transfer chamber 300 may be disposed along the second direction Y. The drying chamber 500 and the transfer chamber 300 may be disposed along the second direction Y. The buffer unit 200 may be located at one end of the transfer chamber 300.

According to the example, the liquid treatment chambers 400 are disposed on both sides of transfer chamber 300, and the drying chambers 500 are disposed on both sides of the transfer chamber 300, and the liquid treatment chambers 400 may be disposed closer to the buffer unit 200 than the drying chambers 500. At one side of the transfer chamber 300, the liquid treatment chambers 400 may be provided in an arrangement of A×B (each of A and B is 1 or a natural larger than 1) in the first direction X and the third direction Z. Further, at one side of the transfer chamber 300, the drying chambers 500 may be provided in number of C×D (each of C and D is 1 or a natural number larger than 1) in the first direction 92 and the third direction 96. Unlike the above, only the liquid treatment chambers 400 may be provided on one side of the transfer chamber 300, and only the drying chambers 500 may be provided on the other side of the transfer chamber 300.

The transfer chamber 300 includes a transfer robot 320. A guide rail 324 of which a longitudinal direction is provided in the first direction X is provided in the transfer chamber 300, and the transfer robot 320 may be provided to be movable on the guide rail 324. The transfer robot 320 includes a hand 322 on which the substrate W is placed, and the hand 322 may be provided to be movable forward and backward directions, rotatable about the third direction Z and movable along the third direction Z. A plurality of hands 322 are provided to be spaced apart in the vertical direction, and the hands 322 may move forward and back ward independently of each other.

The controller 30 may control the substrate treating apparatus. The controller 30 may include a process controller formed of a microprocessor (computer) that executes the control of the substrate treating apparatus, a user interface formed of a keyboard in which an operator performs a command input operation or the like in order to manage the substrate treating apparatus, a display for visualizing and displaying an operation situation of the substrate treating apparatus, and the like, and a storage unit storing a control program for executing the process executed in the substrate treating apparatus under the control of the process controller or a program, that is, a treatment recipe, for executing the process in each component according to various data and treatment conditions. Further, the user interface and the storage unit may be connected to the process controller. The treating recipe may be stored in a storage medium in the storage unit, and the storage medium may be a hard disk, and may also be a portable disk, such as a CD-ROM or a DVD, or a semiconductor memory, such as a flash memory.

The controller 30 may control the configurations of the substrate processing apparatus to perform a substrate processing method described below.

Figure 5:
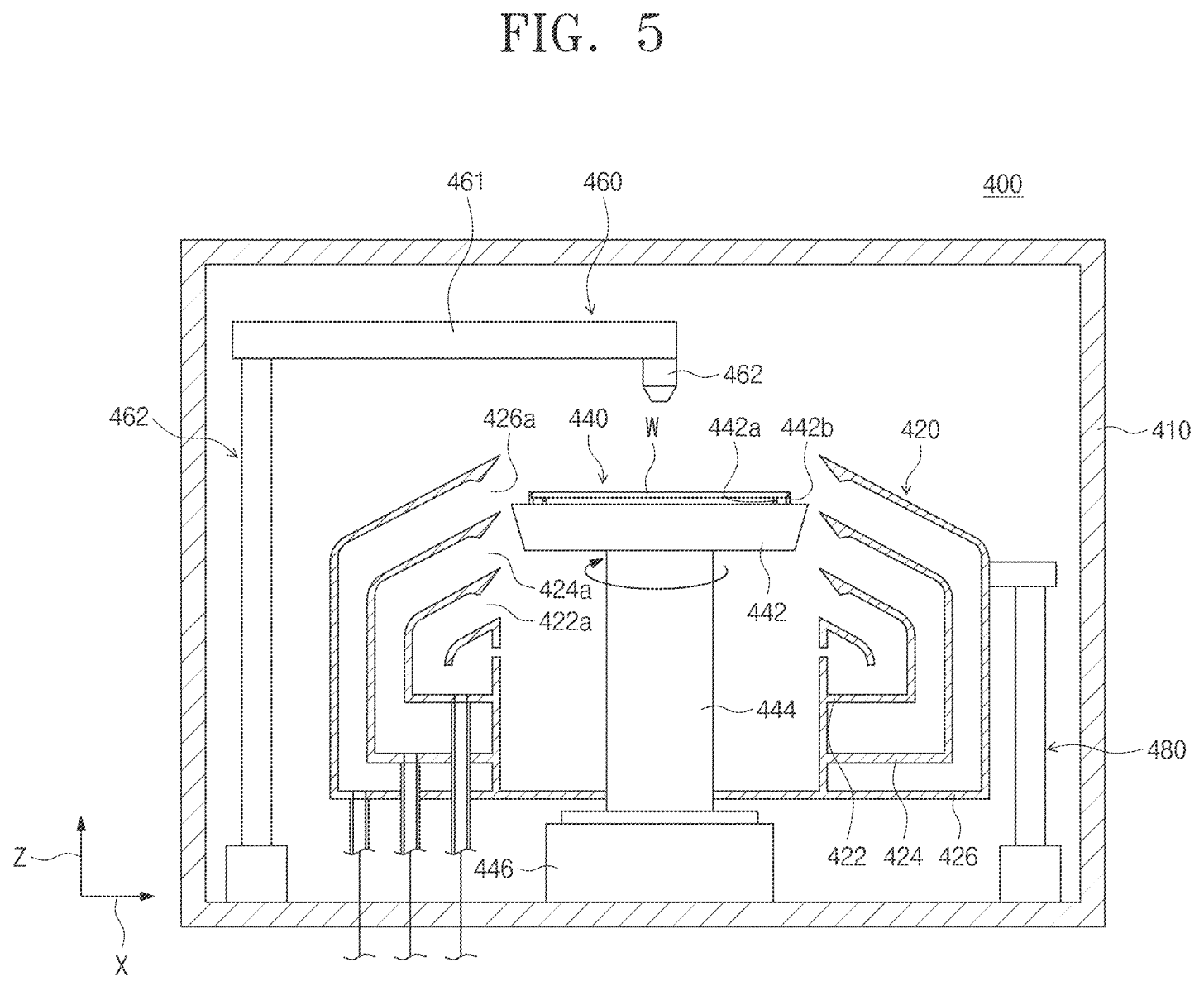

FIG. 5 is a diagram schematically illustrating an exemplary embodiment of the liquid treating chamber of FIG. 4.

Referring to FIG. 5, the liquid treatment chamber 400 includes a housing 410, a treating container 420, a support unit 440, a liquid supply unit 460, and a lifting unit 480.

The housing 410 may have an interior space where the substrate W is processed. The housing 410 may have a generally hexahedral shape. For example, the housing 410 may have a cuboidal shape. Additionally, the housing 410 may have an opening (not illustrated) through which the substrate W is loaded or unloaded. Additionally, the housing 410 may be equipped with a door (not illustrated) that selectively opens and closes the opening.

The treating container 430 may have a cylindrical shape with an open top. The treating container 420 may provide a treating space where the substrate W is processed. The support unit 440 supports the substrate W in the treating space. The liquid supply unit 460 supplies the treatment solution onto the substrate W supported on the support unit 440. The treatment solution may be provided in a plurality of types and may be supplied sequentially onto the substrate W. The lifting unit 480 adjusts the relative height between the treating container 420 and the substrate W placed on the support unit 440.

In one example, the treating container 420 has a plurality of collection containers 422, 424, and 426. Each of the collection containers 422, 424, and 426 has a collection space of collecting the liquid used for the processing of the substrate. Each of the collection containers 422, 424, and 426 is provided with a shape that surrounds the support unit 440. As the liquid treatment process proceeds, the treatment solution scattered by the rotation of the substrate W enters the collection space through inlets 422a, 424a, and 426a of the respective collection containers 422, 424, and 426. In one example, the treating container 420 has the first collection container 422, the second collection container 424, and the third collection container 426. The first collection container 422 is disposed to surround the support unit 440, the second collection container 424 is disposed to surround the first collection container 422, and the third collection container 426 is disposed to surround the second collection container 424.

The second inlet 424a, which introduces liquid into the second collection container 424, may be positioned above a top side of the first inlet 422a, which introduces liquid into the first collection container 422, and the third inlet 426a, which introduces liquid into the third collection container 426, may be positioned above a top side of the second inlet 424a.

The support unit 440 includes a support plate 442 and a driving shaft 444. An upper surface of the support plate 442 may be provided in a generally circular shape, and may have a diameter larger than a diameter of the substrate W. The edge region of a top surface of the support plate 442 may be provided with a support pin 442a that supports the rear surface of the substrate W. The support pin 442a is provided with a top end protruding from the support plate 442 such that the substrate W is spaced a certain distance from the support plate 442.

A chuck pin 442b is provided to an edge of the top surface of the support plate 442. The chuck pin 442b may be provided at the outer side of the support pin 442a. The chuck pin 442b is provided to protrude upwardly from the support plate 442, and chucks the lateral portion of the substrate W so that the substrate W is not separated from the support unit 440 when the substrate W is rotated. A drive shaft 444 is driven by a driver 446 and is coupled to the center of the lower surface of the support plate 442 and rotates the support plate 442 about its central axis.

The liquid supply unit 460 may supply a treatment solution to the substrate W. The liquid supply unit 460 may include an arm 461, a nozzle 462, and a driver 463. The nozzle 462 may be installed at one end of the bar-shaped arm 461. The driver 463 may be configured in the form of a rotating shaft with the third direction Z as the axis of rotation, and may be coupled to the other end of the arm 461. The driver 463 may rotate the arm 461 axially by rotating in the third direction Z as the axis of rotation. Accordingly, the position of the nozzle 462 installed at one end of the arm 461 may be changed.

The nozzle 462 may supply a treatment solution to the substrate W. The treatment solution may be a chemical, a rinse solution, or an organic solvent. The chemical may be a chemical having the nature of strong acid or strong base. Further, the rinse solution may be pure water. Furthermore, the organic solvent may be isopropyl alcohol (IPA).

While only one nozzle 462 is illustrated in FIG. 5, the liquid supply unit 460 may include a plurality of nozzles 462, each of which may be configured to supply a different type of treatment solution. For example, one of the nozzles 462 may supply a chemical, another of the nozzles 462 may supply a rinse solution, and yet another of the nozzles 462 may supply an organic solvent. Further, the controller 30 may control the liquid supply unit 460 to supply a rinse solution from one of the nozzles 462 to the substrate W, followed by supplying an organic solvent from another one of the nozzles 462. Accordingly, the rinse solution supplied on the substrate W may be replaced with an organic solvent having a small surface tension.

The lifting unit 480 may move the treating container 420 in an upward or downward direction. The relative height between the treating container 420 and the substrate W changes as the treating container 420 is moved up and down. The lifting unit 480 may include a power generating device, such as a motor, pneumatic cylinder, or hydraulic cylinder. The lifting unit 480 may adjust the height of the treatment container 420 to differentiate the collection containers 422, 424, and 426 for collecting the treatment solution depending on the type of liquid supplied to the substrate W.

Alternatively, as described above, the treatment container 420 may be fixedly installed and the support plate 442 may be configured to be movable in an up and down direction.

Figure 6:
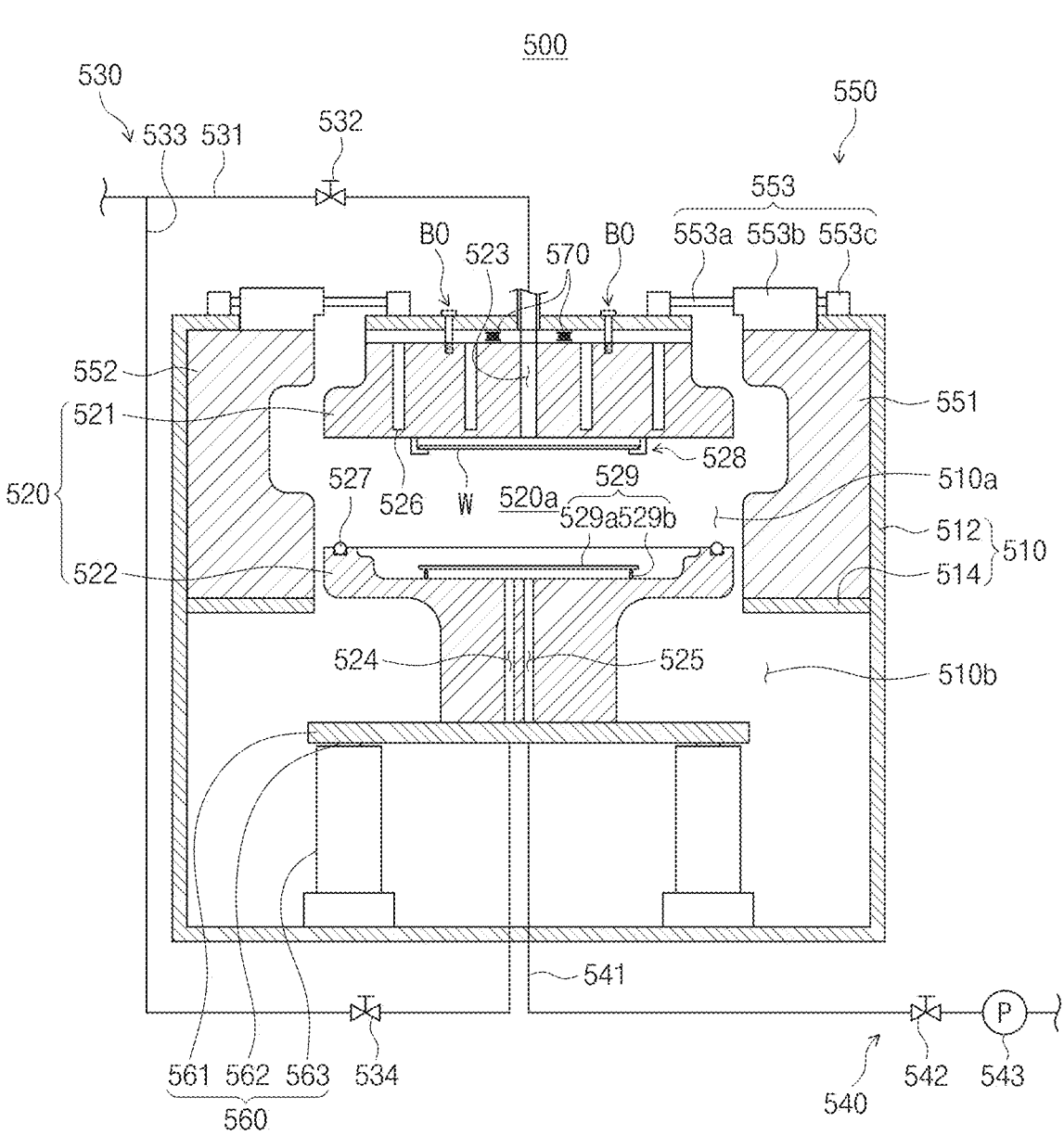
FIG. 6 is a diagram schematically illustrating an exemplary embodiment of a drying chamber of FIG. 4.
Figure 7:
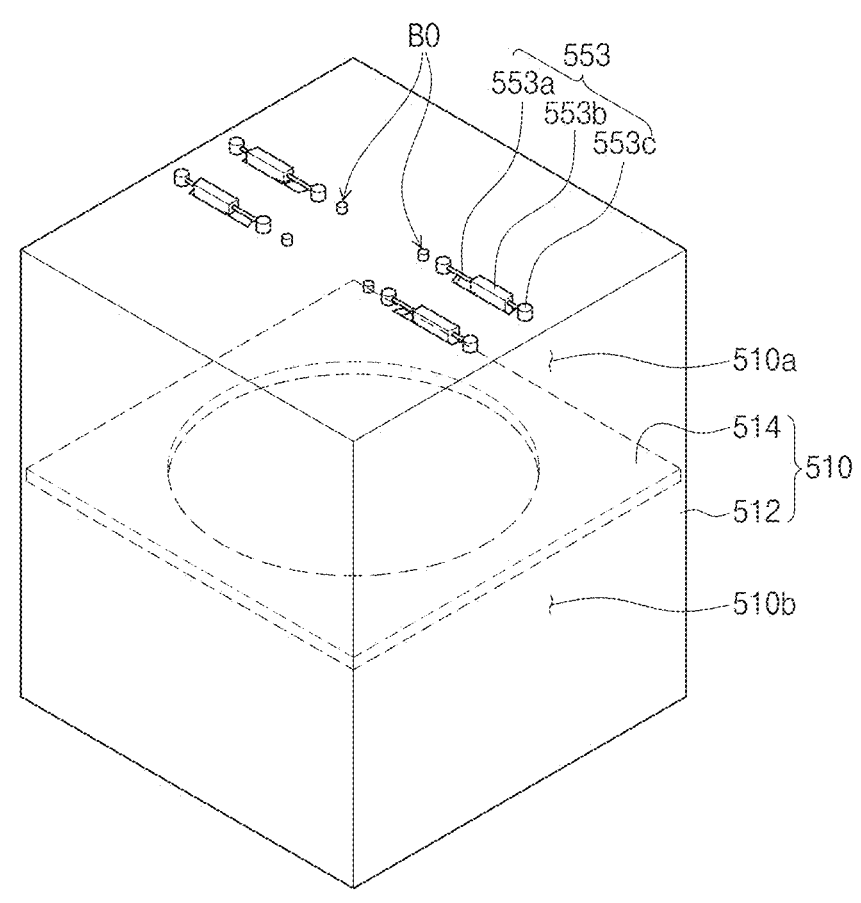
FIG. 7 is a perspective view schematically illustrating a housing of FIG. 6, and a fixing means and a moving module installed in the housing.

FIG. 6 is a diagram schematically illustrating an exemplary embodiment of a drying chamber of FIG. 4, and FIG. 7 is a perspective view schematically illustrating the housing, and a fixing means and a moving module installed in the housing of FIG. 6.

Referring now to FIGS. 6 and 7, the drying chamber 500 according to the exemplary embodiment of the present invention may include a base frame 510, a chamber 520, a fluid supply unit 530, a fluid exhaust unit 540, a clamping unit 550, a lower moving unit 560, and a buffer 570.

The base frame 510 may provide an interior space in which the chamber 520 described later may be disposed. The base frame 510 may include a housing 512, and a middle plate 514.

The housing 512 may have a container shape having an overall cuboidal shape. The housing 512 may have an interior space. In the interior space of the housing 512, the chamber 520, the first and second clamping bodies 551 and 552 of the clamping unit 550, the lower moving unit 560, and the buffer 570 may be disposed.

The intermediate plate 514 may be installed in the interior space of the housing 512 and may have the shape of a plate with a hollow center region thereof. The interior space of the housing 512 may be divided by the intermediate plate 514 into an upper space 510a and a lower space 510b. In the upper space 510a, the first chamber body 521, the first and second clamping bodies 551 and 552 may be disposed, and in the lower space 510b, the lower moving unit 560 may be disposed. The second chamber body 521 may be moved between the lower space 510b and the upper space 510a by the lower moving unit 560. The second chamber body 522 may be moved between the upper space 510a and the lower space 510b by passing through a hollow formed in the intermediate plate 514.

Furthermore, a plurality of moving modules 553 may be installed on the top of the housing 512. Some of the moving modules 553 may be configured to move the first clamping body 521 and other of the moving modules 553 may be configured to move the second clamping body 522.

The chamber 520 may include a first chamber body 521 and a second chamber body 522. The second chamber body 522 may be located under the first chamber body 521. The first chamber body 521 may be an upper body positioned in an upper portion, and the second chamber body 522 may be a lower body positioned in a lower portion.

The first chamber body 521 may have a flat bottom surface, and may be shaped such that the height of the top surface center region is higher than the height of the top surface edge region. The second chamber body 522 may have a top surface that is formed to be indented from top to bottom to define a treating space 520a, and may have a shape in which the height of the top surface edge region is higher than the height of the bottom surface center region. When the first chamber body 521 and the second chamber body 522 are assembled together, at least a portion of the edge regions of the first chamber body 521 and the second chamber body 522 may have a shape that is inserted into the clamping bodies 551 and 552 described later.

The chamber 520 may provide the treating space 520a in which the substrate W is processed. The first chamber body 521 and the second chamber body 522 may be assembled with each other to provide the treating space 520a in which the substrate W is processed. The treating space 520a may be open or sealed by movement of either of the first chamber body 521 and the second chamber body 522.

For example, the second chamber body 522 may be moved in an upward direction to define a sealed treating space 520a with the first chamber body 521, optionally with the first chamber body 521 and a sealing member 527. Such a position of the second chamber body 522 may be defined as a closed position. Further, the second chamber body 522 may move in a downward direction and be separated from the first chamber body 521 to open the treating space 520a. Such a position of the second chamber body 522 may be defined as an open position.

The first chamber body 521 may be provided with a first supply port 523. The first supply port 523 may be formed by machining a hole in the first chamber body 521 itself, or may be provided in the form in which a pipe is inserted into a hole formed in the first chamber body 521.

The first supply port 523 may be connected to the first supply line 531 described later. The first supply port 523 may supply a treatment solution to the treating space 520a. An outlet of the first supply port 523 may be configured to face a lower region of the treating space 520a. The outlet of the first supply port 523 may face an upper surface of the substrate W placed on a support member 528.

The second chamber body 522 may be provided with a second supply port 524 and an exhaust port 525. The second supply port 524 and the exhaust port 525 may be formed by machining holes in the second chamber body 522 itself, or may be provided in the form in which a pipe is inserted into a hole formed in the second chamber body 522.

The second supply port 524 may be connected to a second fluid supply line 533, which is to be described later. The second supply port 524 may supply a treatment fluid to the treating space 520a. The outlet of the second supply port 524 may be configured to face an upper region of the treating space 520a. The outlet of the second supply port 524 may be provided to face a blocking member 529 which is to be described later.

The exhaust port 525 may be connected to an exhaust line 541 described later. The exhaust port 525 may be located parallel to the second supply port 524. The exhaust port 525 may exhaust the atmosphere of the treating space 520a via the exhaust line 541.

The chamber 520 may be provided with a heater 526, the sealing member 527, the support member 528, and the blocking member 529.

The heater 526 may be installed while being buried in the chamber 520. The heater 526 may generate heat to maintain the temperature of the treating space 520a at a set temperature. The set temperature may be a temperature equal to or higher than a critical temperature at which the treatment fluid supplied to the treating space 520a may maintain a supercritical state. The heater 526 may be installed while being buried in the first chamber body 521. However, without limitation, the heater 526 may also be installed while being buried in the second chamber body 522.

The sealing member 527 may seal the treating space 520a such that treatment fluid supplied to the treating space 520a does not leak out of the treating space 520a when the second chamber body 522 is in the closed position. The sealing member 527 may be an O-ring. The sealing member 527 may be formed of a material having elasticity. The sealing member 527 may be formed of rubber, or a plastic material having elasticity.

The sealing member 527 may be installed between the first chamber body 521 and the second chamber body 522. For example, the sealing member 527 may be installed by being inserted into a ring-shaped groove formed in a top surface edge region of the second chamber body 522.

The support member 528 may support the substrate W. The support member 528 may be configured to support the bottom surface of the substrate W. The support member 528 may be installed on the bottom surface of the first chamber body 521. The support members 528 may be provided in pairs. The support member 528 may extend in a top-to-bottom direction and may have an end having a shape bent in a horizontal direction. The support member 528 may be configured to support only the bottom surface edge region of the substrate W, which may reduce the risk of scratching the bottom surface of the substrate W.

The blocking member 529 may block high pressure treatment fluid supplied from the second supply port 524 from being directly supplied to the lower surface of the substrate W. The blocking member 529 may include a blocking plate 529a facing the outlet of the second supply port 524, and a leg 529b spacing the blocking plate 529a away from the second chamber body 522.

The fluid supply unit 530 may supply treatment fluid to the treating space 520a. The fluid supply unit 530 may supply carbon dioxide that is a supercritical fluid to the treating space 520a. The treatment fluid supplied to the treating space 520a may dry the substrate W by removing organic solvents, such as IPA, that may remain on the substrate W.

The fluid supply unit 530 may include a first supply line 531, a first supply valve 532, a second supply line 533, and a second supply valve 534. The first supply line 531 and the second supply line 533 may receive treatment fluid from a fluid supply source (not illustrated) and may supply the treatment fluid to the treating space 520a. The first supply line 531 may be connected to the first supply port 523 described above to supply the treatment fluid to the upper portion of the treating space 520a. The second supply line 5330 may be connected to the second supply port 524 described above to supply treatment fluid to the lower portion of the treating space 520a.

A first supply valve 532 and a second supply valve 534 may be installed in the first supply line 531 and the second supply line 533, respectively, to allow or block the flow of treatment fluid in the first supply line 531 and the second supply line 533. The first supply valve 532 and the second supply valve 534 may be provided as automatic valves that may be turned on/off by receiving a control signal from the controller 30.

The fluid exhaust unit 540 may exhaust the atmosphere of the treating space 520a. The fluid exhaust unit 540 may exhaust the treatment fluid supplied to the treating space 520a to the outside of the drying chamber 500. The fluid exhaust unit 540 may include an exhaust line 541, an exhaust valve 542, and a pressure reducer 543.

The exhaust line 541 may be connected to the exhaust port 525 described above, and may exhaust the atmosphere of the treating space 520a through the exhaust port 525 to depressurize the treating space 520a. The exhaust line 541 may be connected to a pressure reducer 543, such as a pump, and the pressure reducer 543 may provide pressure reduction to exhaust the treating space 520a.

The exhaust valve 542 may allow or block the flow of treatment fluid in the exhaust line 541. The exhaust valve 542 may be provided as an automatic valve that may be turned on/off by receiving a control signal from the controller 30.

The clamping unit 550 may clamp the chamber 520. The clamping unit 550 may clamp the chamber 520 when the second chamber body 522 is in the closed position. The clamping unit 550 clamps the chamber 520 during substrate processing to prevent excessive loads from being applied on the lower moving unit 560 to seal the treating space 520a.

The clamping unit 550 may include a first clamping body 551, a second clamping body 552, and a moving module 553. The first clamping body 551 and the second clamping body 552 may have a shape that is symmetrical to each other. The first clamping body 551 and the second clamping body 552 may have a central region of the surface facing the chamber 520 that is indented in a direction away from the chamber 520 to form a groove. Into the groove, an edge region of the chamber 520 may be inserted.

The moving module 553 may move the clamping bodies 551 and 552 between a clamping position and an unclamping position. The clamping position may be a position for clamping the chamber 520 when the second chamber body 522 is in the closed position. Clamping may mean the insertion of an edge portion of the chamber 520 into the groove formed in the clamping bodies 551 and 552. The unclamping position may mean a position in which the edge portion of the chamber 520 is deviated from the grooves formed in the clamping bodies 551 and 552.

The moving module 553 may have a plurality of moving modules. The moving module 553 may be installed on an upper portion of the housing 512. The moving module 553 may be installed on the upper portion of the housing 512 to move the first clamping body 551 and the second clamping body 552 along a horizontal direction. The moving modules 553 may each include a guide rail 553a, a bracket 553b, and a actuator 553c. The actuator 553c may be provided as a motor, an air cylinder, or a hydraulic cylinder. Alternatively, the moving module 553 may be configured such that the bracket 553b moves along the guide rail 553a in a magnetic levitation manner. The guide rail 553a may extend along a horizontal direction. The bracket 553b may be configured to be movable along the guide rail 553a, and may have a lower portion coupled to upper portions of the first and second clamping bodies 551, 552.

In FIG. 6, the moving module 553 is illustrated as being positioned on top of the first and second clamping bodies 551 and 552, but the present invention is not limited thereto. For example, the moving module 553 may be provided in a form installed on the lower portion of the intermediate plate 514. That is, the moving module 553 is positioned on the lower side of the first and second clamping bodies 551 and 552 to move the first and second clamping bodies 551 and 552 along a horizontal direction.

The lower moving unit 560 may move the second chamber body 522, which may be a lower chamber body. The lower moving unit 560 may move the second chamber body 522 in an up-down direction. The lower moving unit 560 may include a movement plate 561, a lower movement shaft 562, and a lower driver 563. An upper portion of the movement plate 561 may be engaged with a lower portion of the second chamber body 522. A lower portion of the movement plate 561 may be coupled to the lower movement shaft 562. The lower movement shaft 562 may be moved in an up-down direction by the lower driver 563. The lower actuator 563 may be provided by any one of an air cylinder, a hydraulic cylinder, and a motor. Alternatively, the lower moving unit 560 may be configured to move the lower movement shaft 562 in an up-down direction in the magnetic levitation manner.

The first chamber body 521 may be secured to the top of the housing 512 by a fixing means BO. The fastening means BO may be provided as a shoulder bolt. The first chamber body 521 and the housing 512 may be spaced apart by the fixing means BO. A plurality of buffers 570 may be disposed between the first chamber body 521 and the housing 512.

Figure 8:
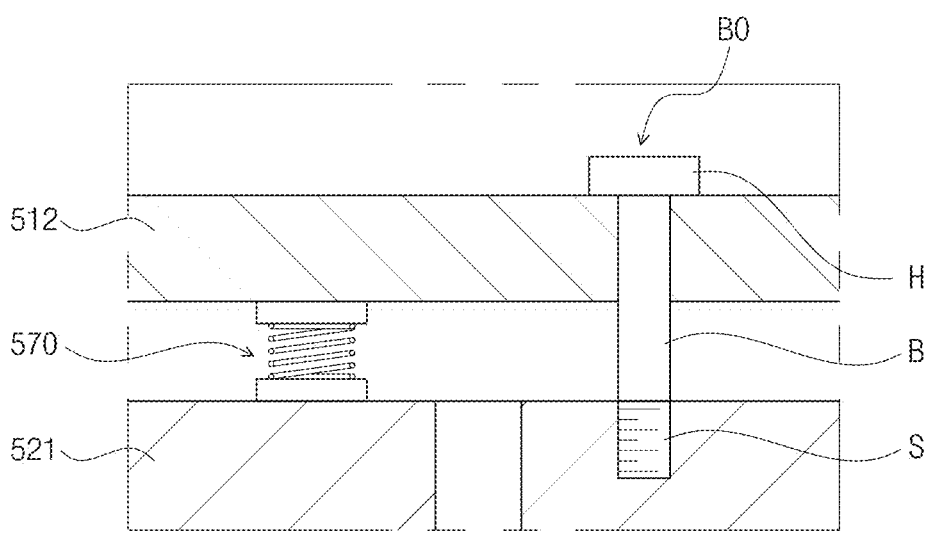
FIG. 8 is a diagram illustrating an enlarged view of a portion of the drying chamber of FIG. 6.

FIG. 8 is a diagram illustrating an enlarged view of a portion of the drying chamber of FIG. 6.

Referring to FIG. 8, the fixing means BO, which may be a shoulder bolt, may be formed of a head H, a body B, and a threaded portion S. The body B may be provided with a smooth surface, and the threaded portion S may be screwed to an upper portion of the first chamber body 521. The head H may be placed on the top surface of the housing 512 to be provided as a hanging portion.

The first chamber body 521 may be fixed in the form suspended to the housing 512 by the securing means BO. Between the first chamber body 521 and the housing 512, a buffer 570 including a spring may be provided.

Since the lowest height of the first chamber body 521 is limited by the fixing means BO, the vertical length of the spring of the buffer 570 may not be excessively stretched. Furthermore, the first chamber body 521 has a certain degree of freedom to move in the upward direction by the body B of the fixing means BO. When the first chamber body 521 is moved in the upward direction by the lower moving unit 560, the buffer 570 may prevent a collision of the first chamber body 521 and the housing 512, or may buffer the vibrations that result from the collision.

Figure 9:
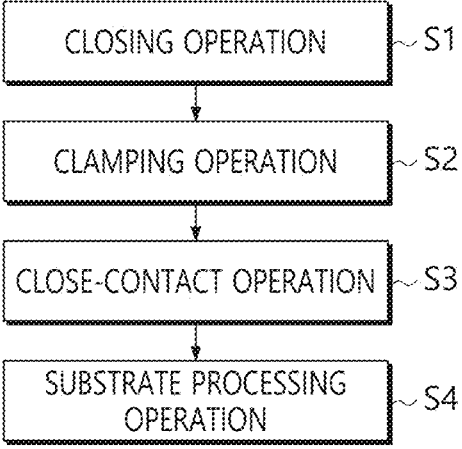
FIG. 9 is a flow chart illustrating a method of controlling a substrate processing apparatus according to an exemplary embodiment of the present invention.

FIG. 9 is a flow chart illustrating a method of controlling a substrate processing apparatus according to an exemplary embodiment of the present invention. The operations of the drying chamber 500 illustrated in FIG. 9 may be implemented by controlling configurations of the drying chamber 500 by control signals generated by the controller 30. Further, the controller 30 may be programmed to generate control signals to enable the drying chamber 500 to implement the operations illustrated in FIG. 9.

Through the method of controlling the substrate processing apparatus according to the exemplary embodiment of the present invention, a substrate W, which may be a wafer, may be processed, and a semiconductor device may be manufactured through the process.

A method of controlling a substrate processing apparatus according to an exemplary embodiment of the present invention may include a closing operation S1, a clamping operation S2, a close-contact operation S3, and a substrate processing operation S4. The closing operation S1, the clamping operation S2, the close-contact operation S3, and the substrate processing operation S4 may be sequentially performed.

Figure 10:
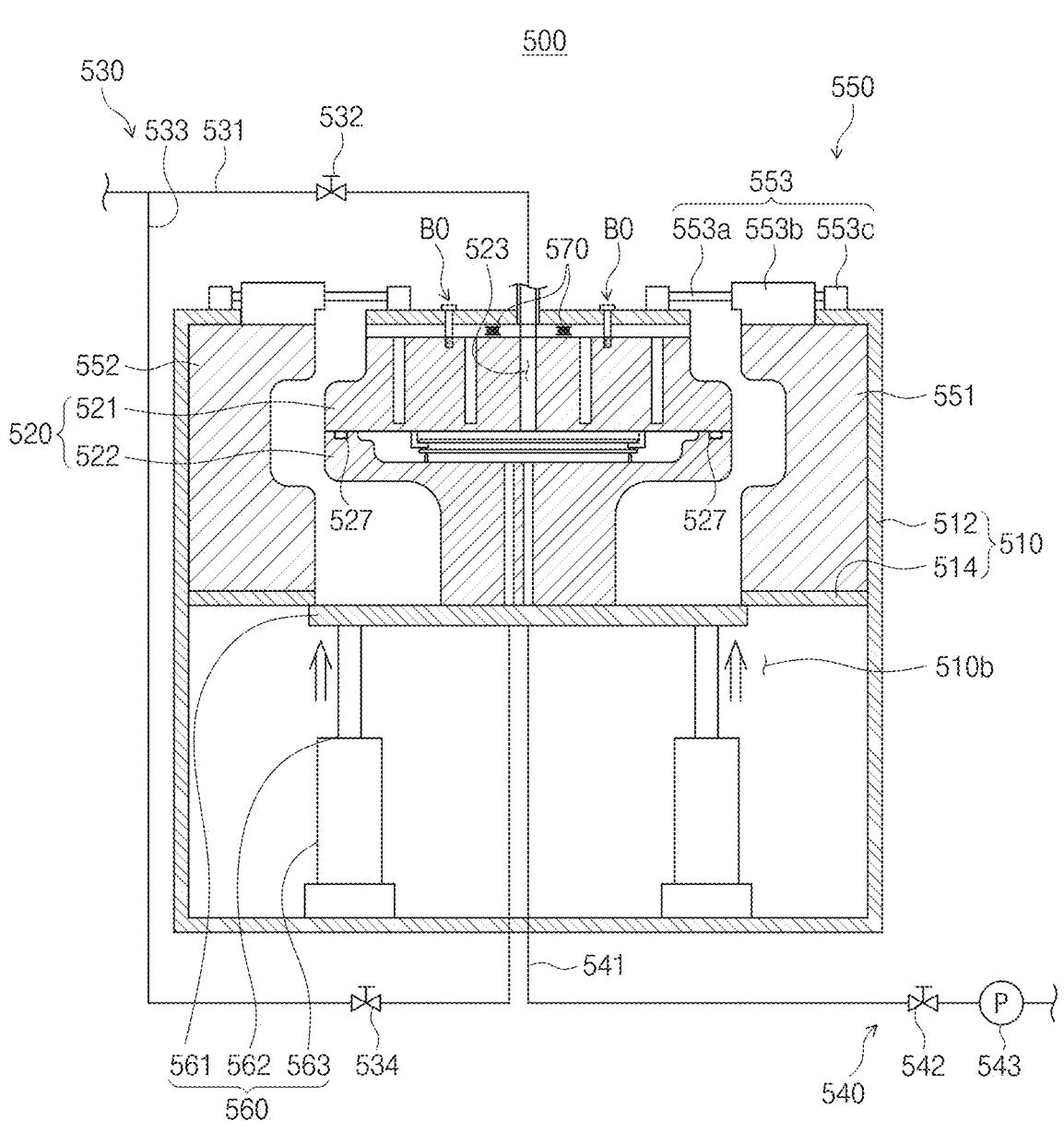
FIG. 10 is a diagram illustrating the drying chamber performing a closing operation of FIG. 9.

FIG. 10 is a diagram illustrating the drying chamber performing the closing operation of FIG. 9.

Referring to FIGS. 9 and 10, the lower moving unit 560 may move the second chamber body 522 in an upward direction to seal the treating space 520a. The lower moving unit 560 may raise the second chamber body 522 to a position where the second chamber body 522 is in contact with the first chamber body 521, but where the sealing member 527 may be compressed. When the closing operation S1 is completed, upward force applied by the lower moving unit 560 is not transmitted to the first chamber body

521, and only upward force may be transmitted to the first chamber body 521 as the sealing member 527 is compressed.

In this case, the height of the first chamber body 521 may remain unchanged. For this purpose, the spring of the buffer 570 may be selected to have a spring with an elastic modulus such that it is not compressed by the force applied in an upward direction to the first chamber body 521 by compression of the sealing member 527.

Figure 11:
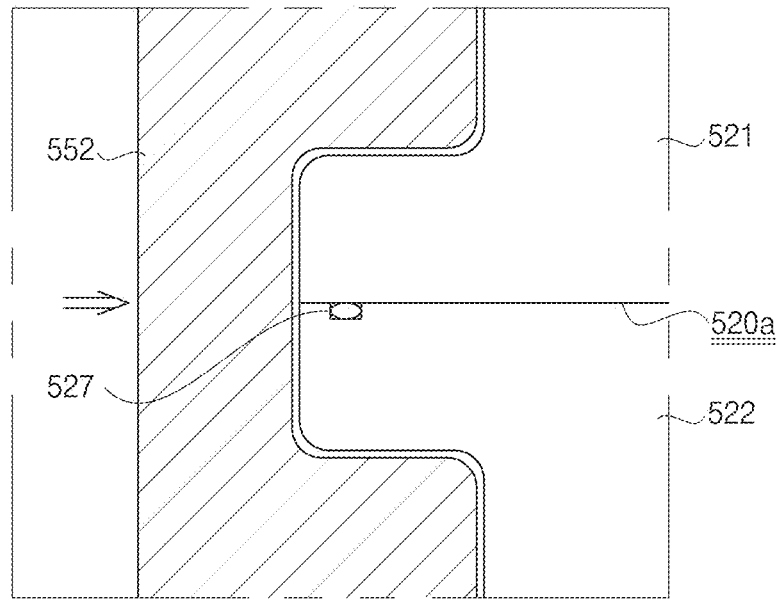
FIG. 11 is a diagram illustrating the drying chamber performing a clamping operation of FIG. 9.

FIG. 11 is a diagram illustrating the drying chamber performing the clamping operation of FIG. 9.

Referring to FIGS. 9 and 11, in the clamping operation S2, the moving module 553 may move the clamping bodies 551 and 552 in a direction that brings the clamping bodies 551 and 552 closer to the chamber 520 to clamp the chamber 520. At this time, the clamping bodies 551 and 552 and the chamber 520 may be spaced apart by a certain interval so that no friction occurs between the clamping bodies 551 and 552 and the chamber 520.

Figure 12:
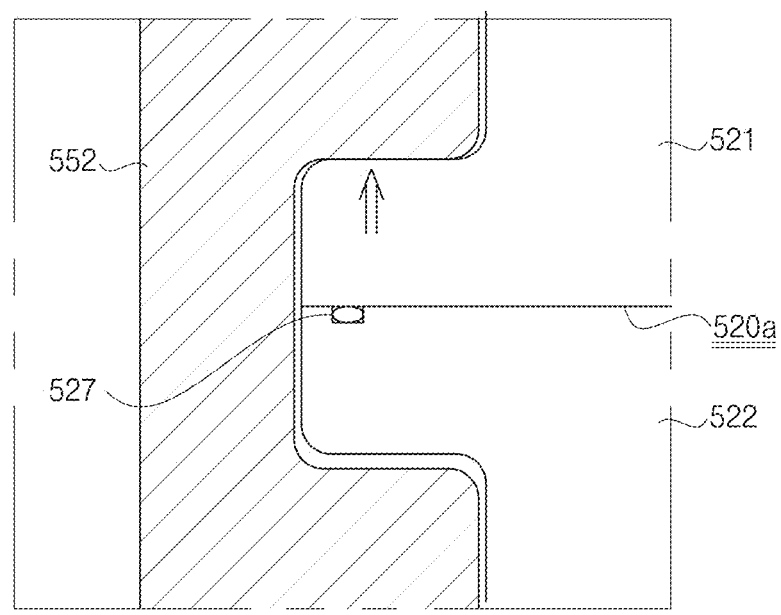
FIG. 12 is a diagram illustrating the drying chamber performing a close-contact operation of FIG. 9.

FIG. 12 is a diagram illustrating the drying chamber performing the close-contact operation of FIG. 9.

Referring to FIGS. 9 and 12, the close-contact operation S3 may include making the chamber 520 be in contact with the clamping bodies 551 and 552. The close-contact operation S3 may include further moving the second chamber body 522 in the closed position to make the chamber 520 be in contact with the clamping bodies 551 and 552. More specifically, the second chamber body 522 may be further moved in an upward direction to make the first chamber body 521 be in contact with the upper portion of the groove formed in the clamping bodies 551 and 552.

In this case, the spring having the buffer 570 may be compressed by the force applied by the lower moving unit 560 in the upward direction. In other words, the spring of the buffer 570 may have a spring having an elastic modulus that may be compressed by the force applied by the lower moving unit 560 in the upward direction.

In other words, the buffer 570 may be configured such that the first chamber body 521 and the second chamber body 522 do not change position (more specifically, height) of the first chamber body 521 when the first chamber body 521 and the second chamber body 522 are in close contact with each other, but the first chamber body 521 is changed in position (more specifically, height) in a direction such that the first chamber body 521 is closer to the housing 512 when the lower moving unit 560 makes the first chamber body 521 be in contact with the clamping bodies 551 and 552.

Figure 13:
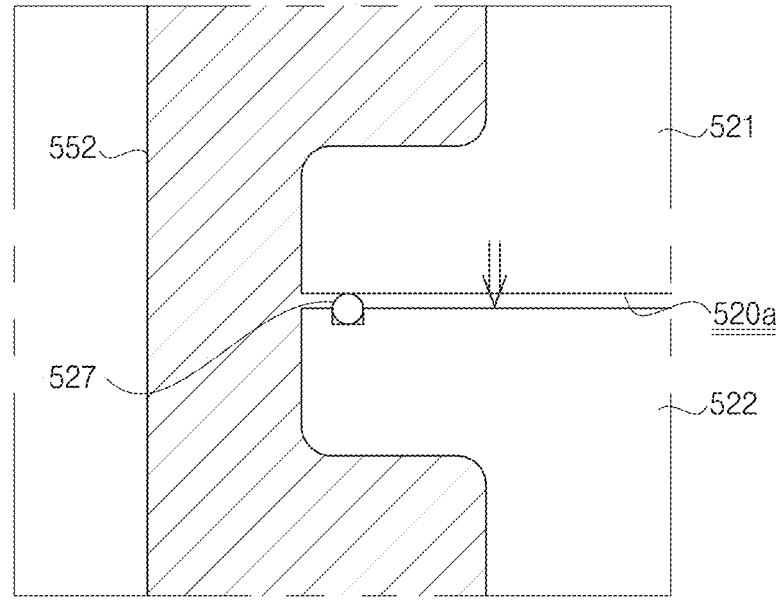
FIG. 13 is a diagram illustrating the drying chamber performing a substrate processing operation of FIG. 9.

FIG. 13 is a diagram illustrating the drying chamber performing the substrate processing operation of FIG. 9.

Referring to FIGS. 9 and 13, the substrate processing operation S4 may include supplying a high-pressure treatment fluid into the treating space 520a to dry the substrate W. The high-pressure treatment fluid is supplied to the treating space 520a to increase the pressure in the treating space 520a. As the pressure in the treating space 520a increases, the gap between the first chamber body 521 and the second chamber body 522 widens. At this time, since the first chamber body 521 has already moved in the upper direction and is in close contact with the clamping bodies 551 and 552 by the close-contact operation S3, the height of the first chamber body 521 remains unchanged, and only the second chamber body 522 moves in the lower direction and is in contact with the clamping body 552.

Although the second chamber body 522 may collide with the clamping bodies 551 and 552 as the second chamber body 522 is brought into contact with the clamping bodies 551 and 552, the support member 528 supporting the substrate W is installed on the first chamber body 521 to minimize the impact transmitted to the substrate W, vibration generated in the substrate W, or misplacement of the substrate W due to the collision.

Figure 14:
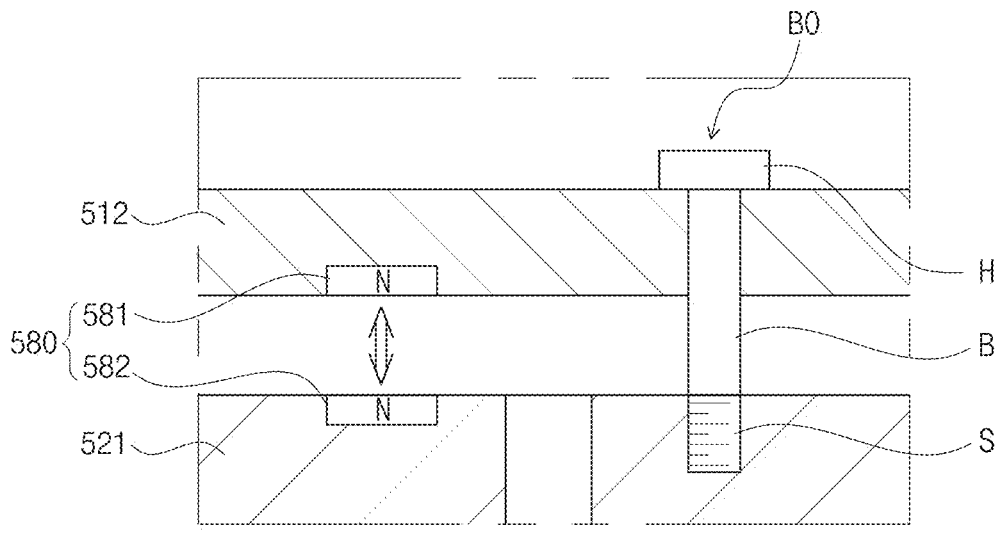
FIG. 14 is a diagram illustrating a buffer according to another exemplary embodiment of the present invention.

FIG. 14 is a diagram illustrating a buffer according to another exemplary embodiment of the present invention. Referring to FIG. 14, the buffer 580 according to another exemplary embodiment of the present invention may include a first magnetic element 581 installed in the housing 512 and a second magnetic element 582 installed in the first chamber body 521. The first and second magnetic elements 581 and 582 may be provided as permanent magnets. Furthermore, the first and second magnetic elements 581 and 582 may be provided to have the same polarity as each other to generate repulsive force between the first and second magnetic elements 581 and 582.

The first and second magnetic bodies 581 and 582 may have a permanent magnet having magnetic force to the degree which does not change the position (more specifically, the height) of the first chamber body 521 when the first chamber body 521 and the second chamber body 522 are in close contact with each other, and changes the position of the first chamber body 521 in the direction in which the first chamber body 521 is close to the housing 512 when the lower moving unit 560 makes the first chamber body 521 be in contact with the clamping bodies 551 and 552.

Figure 15:
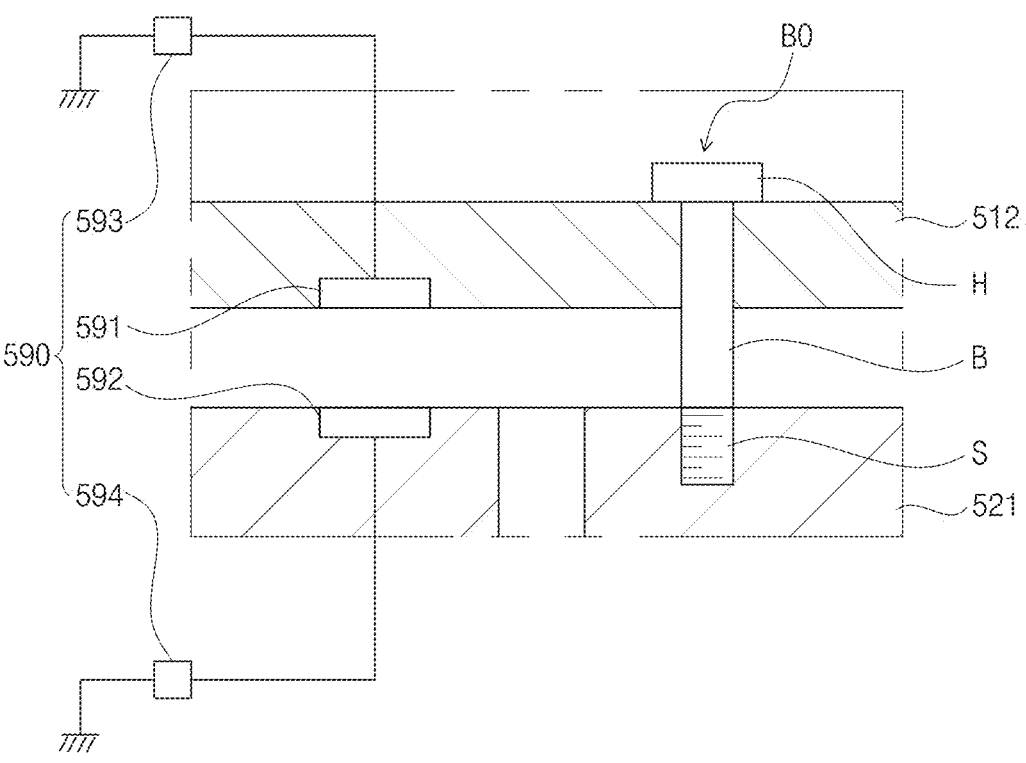
FIG. 15 is a diagram illustrating a buffer according to another exemplary embodiment of the present invention.

FIG. 15 is a diagram illustrating a buffer according to another exemplary embodiment of the present invention. The buffer 590 according to another exemplary embodiment of the present invention may include a first magnetic element 591 installed in the housing 512, a second magnetic element 592 installed in the first chamber body 521, a first current source 593 supplying current to the first magnetic element 591, and a second current source 594 supplying current to the second magnetic element 592. In other words, the first and second magnetic elements 591 and 592 may be provided as electromagnets.

The first and second current sources 593 and 594 may supply current in a size generating magnetic force to the degree which does not change the position (more specifically, the height) of the first chamber body 521 when the first chamber body 521 and the second chamber body 522 are in close contact with each other, and changes the position of the first chamber body 521 in the direction in which the first chamber body 521 is close to the housing 512 when the lower moving unit 560 makes the first chamber body 521 be in contact with the clamping bodies 551 and 552.

Alternatively, the first and second current sources 593 and 594 may change the direction of the current supplied to the first and second magnetic elements 591 and 592 such that the first and second magnetic elements 591 and 592 have the same polarity as each other, or the first and second magnetic elements 591 and 592 have the same polarity as each other.

For example, the first and second magnetic elements 591 and 592 may have the same polarity in the closing operation S1 and the clamping operation S2, and the first and second magnetic elements 591 and 592 may have different polarities in the close-contact operation S3 and the substrate processing operation S4 to make the first chamber body 521 be in contact with the clamping bodies 551 and 552.

Figure 16:
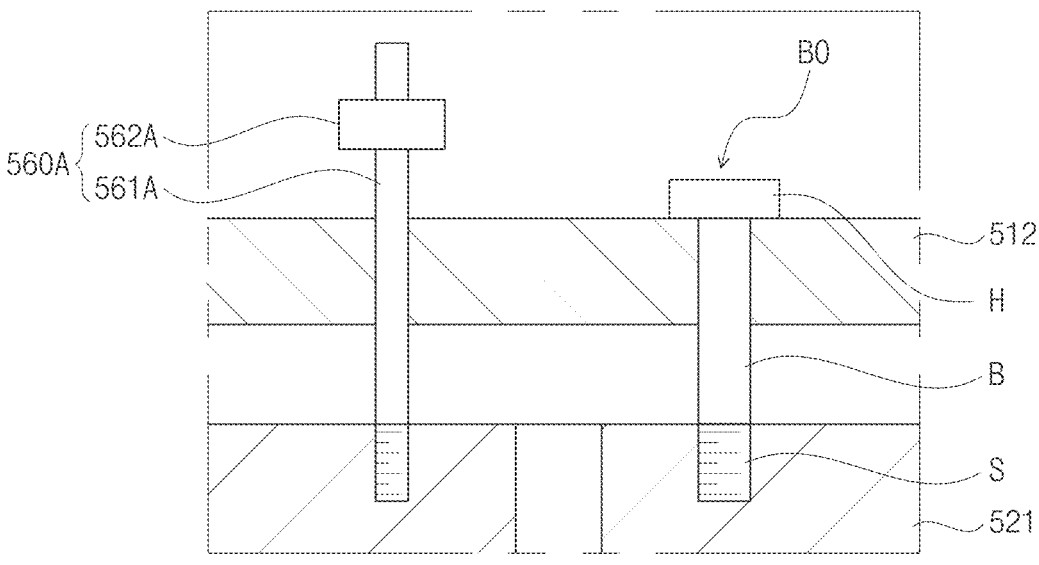
FIG. 16 is a diagram illustrating an upper moving unit that is further providable in the drying chamber.
Figure 17:
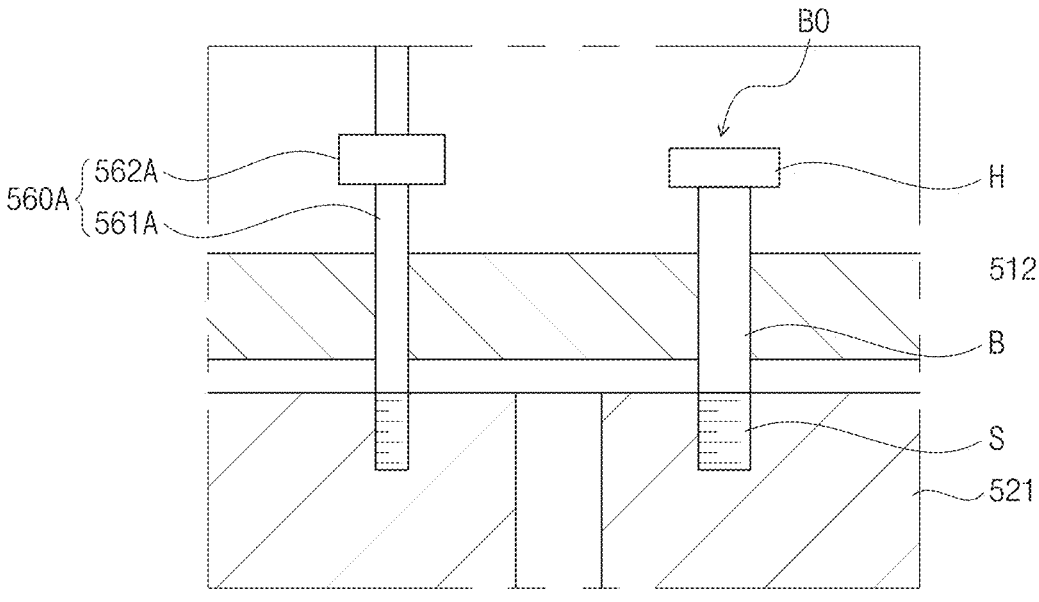
FIG. 17 is a diagram illustrating the upper moving unit of FIG. 16 moving a first chamber body in an upward direction.

FIG. 16 is a diagram illustrating an upper moving unit that is further providable in the drying chamber, and FIG. 17 is a diagram illustrating the upper moving unit of FIG. 16 moving the first chamber body in an upward direction.

The upper moving unit 560A may move the first chamber body 521 in an upward direction. The upward moving unit 560A may include an upward movement shaft 561A and an upward driver 562A. The upper movement shaft 561A may be coupled to the first chamber body 521. The upper driver 562A may lift the first chamber body 521 by changing the height of the upper movement shaft 561A. The height change of the first chamber body 521 by the upper moving unit 560A may be implemented in the close-contact operation S3 described above.

The above example illustrates, but is not limited to, the drying chamber 500 in which the first and second chamber bodies 521 and 522 are disposed in an up-down direction.

Figure 18:
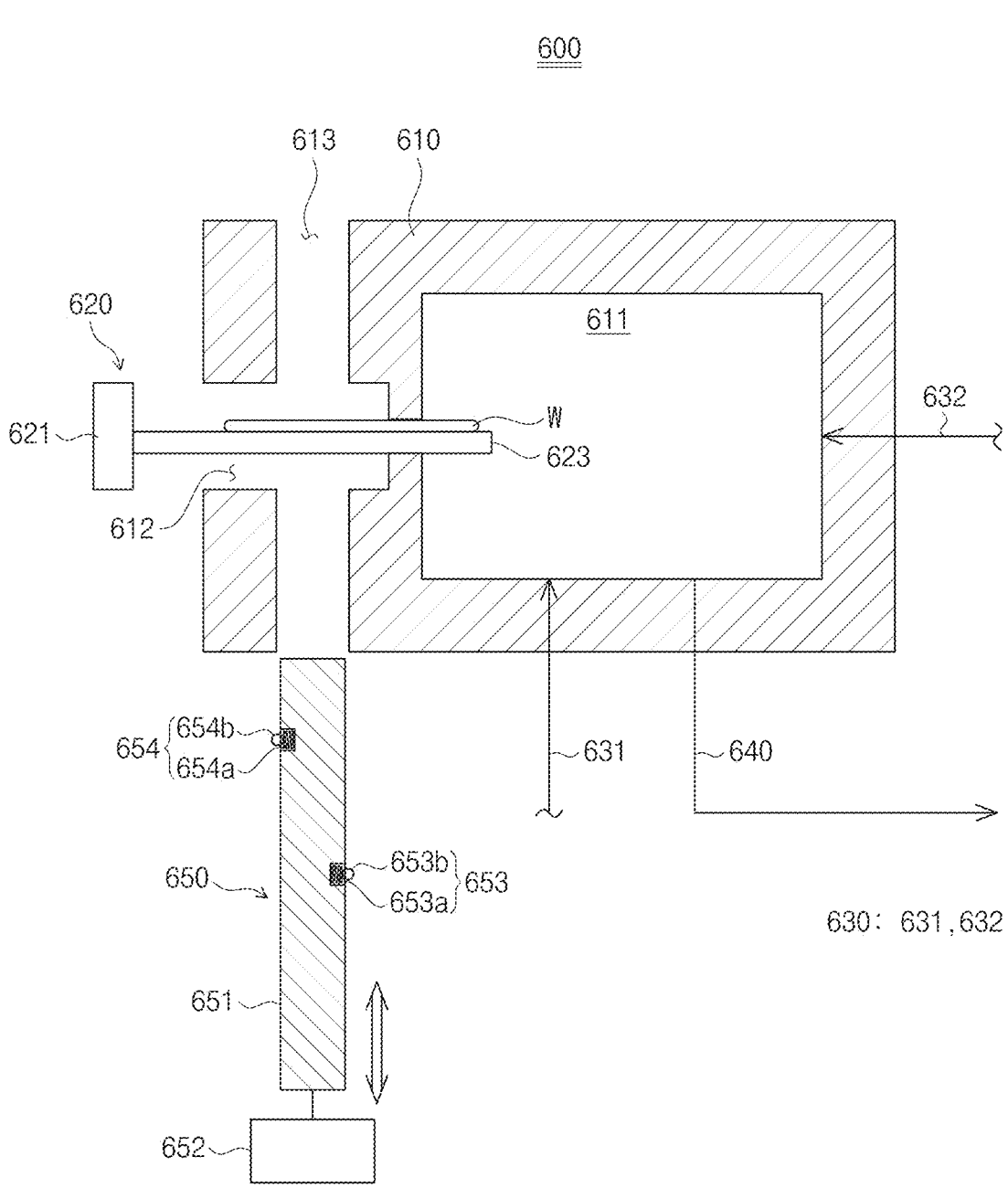
FIG. 18 is a diagram illustrating the drying chamber according to another exemplary embodiment of the present invention.

FIG. 18 is a diagram illustrating the drying chamber according to another exemplary embodiment of the present invention. Referring to FIG. 18, the drying chamber 600 may include a high-pressure container 610, which may be a first chamber body, a door assembly 620, a fluid supply unit 630, an exhaust line 640, and a clamping unit 650.

The high-pressure container 610 may have a treating space 611 inside where the substrate W may be processed. The door assembly 620 may include a door 621, which may be a second chamber body, and a support member 623 that supports the substrate W. The high-pressure container 610 and the door 621 may be referred to as the chamber.

The door 621 and the high-pressure container 610 may be combined with each other to define the treating space 611, and the door 621 may be moved between a closed position that seals the treating space 611 and an open position that opens the treating space 611.

The fluid supply unit 630 may include a first supply line 631 and a second supply line 632, and the first supply line 631 and the second supply line 632 may supply treatment fluid, which may be carbon dioxide, to different locations in the treating space 611. The exhaust line 640 may exhaust the atmosphere of the treating space 611.

Further, the high-pressure container 610 may have an insertion hole 613 formed into which the clamping body 651 of the clamping unit 650 may be inserted.

The clamping unit 650 may clamp the door 621. The clamping unit 650 may include a clamping body 651 and a moving unit 652. The clamping body 651 may have a plate shape that may be inserted into the insertion hole 613, and the moving unit 652 may include any one of an air cylinder, a hydraulic cylinder, and a motor, or may move the clamping body 651 in an up and down direction in the magnetic levitation manner.

Further, among the surfaces of the clamping body 651, a first buffering member 653 may be provided on the surface facing the treating space 611, and a second buffering member 654 may be provided on the opposite side. The first buffering member 653 may be formed of a first sealing element 653a and a first elastic element 653b, and the second buffering member 654 may be formed of a first sealing element 654a and a first elastic element 654b.

Figure 19:
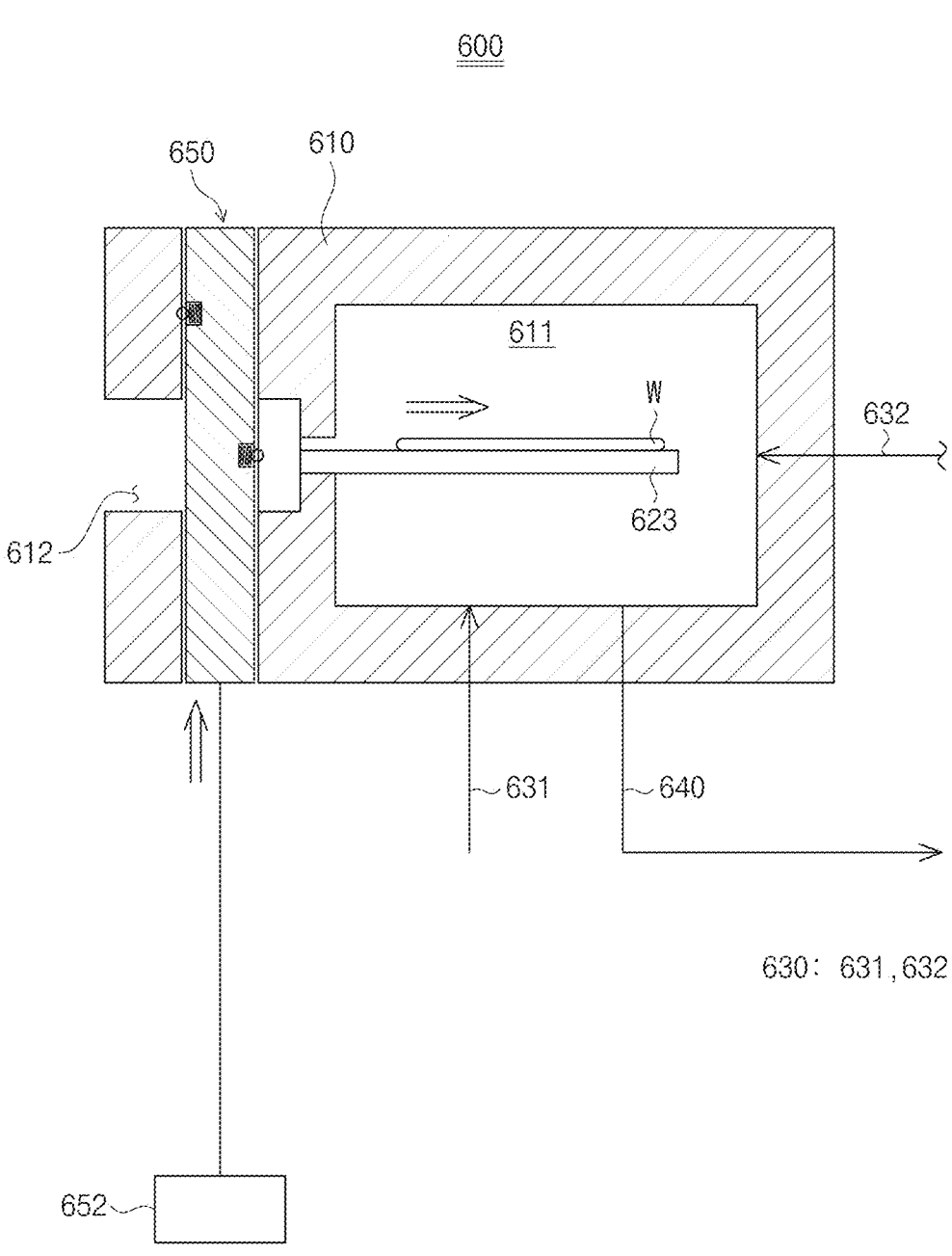
FIG. 19 is a diagram illustrating the drying chamber of FIG. 18 performing a closing operation and a clamping operation.

FIG. 19 is a diagram illustrating the drying chamber of FIG. 18 performing the closing operation and the clamping operation. Referring to FIG. 19, when the drying chamber 600 performs a closing operation, the door 621 may move to a closed position to seal the treating space 611. Thereafter, the plate-shaped clamping body 651 of the clamping unit 650 may be inserted into the insertion hole 613 to clamp the door 621.

Figure 20:
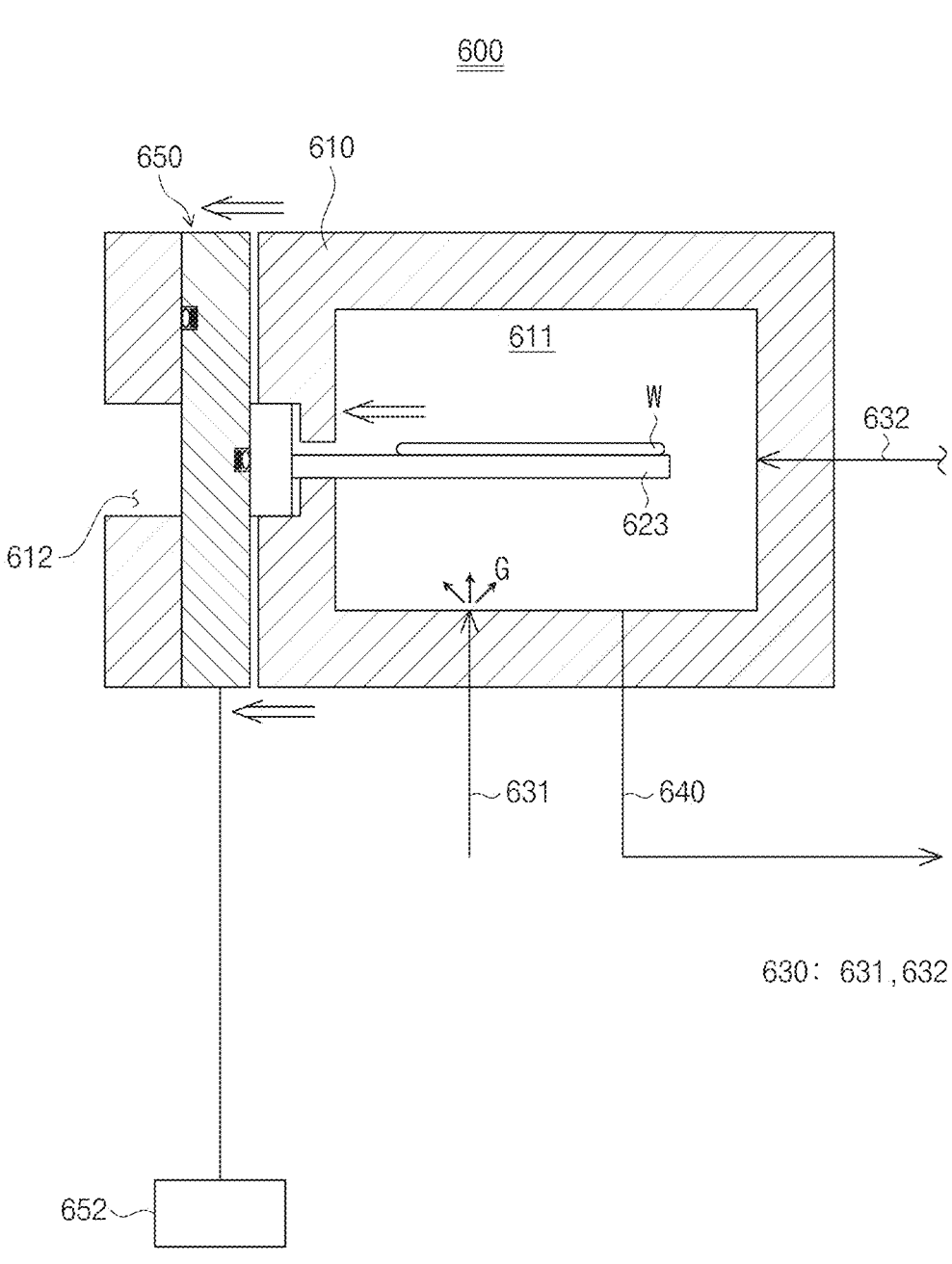
FIG. 20 is a diagram illustrating the drying chamber of FIG. 18 performing a close-contact operation.

FIG. 20 is a diagram illustrating the drying chamber of FIG. 18 performing the close-contact operation. The close-contact operation may be an operation of making the door 621 be in contact with the clamping body 651. The close-contact operation may be implemented by a moving unit (not illustrated) that moves the door 621 in a lateral direction.

Alternatively, the fluid supply unit 630 may also be implemented by supplying treatment fluid to the treating space 611. When the fluid supply unit 630 supplies treatment fluid into the treating space 611, the pressure in the treating space 611 may increase. As the pressure in the treating space 611 increases, the door 621 may move laterally to be in close contact with the clamping body 651. Since the position of the high-pressure container 610 is fixed, only the door 621 may move laterally to be in close contact with the clamping body 651. In this case, the amount of treatment fluid supplied per unit time to the treating space 611 may be small so that excessive shock is not transmitted to the door 621 when the door 621 is in close contact with the clamping body 651. For example, the amount of treatment fluid supplied per unit time to the treating space 611 during the close-contact operation may be smaller than the amount of treatment fluid supplied per unit time to the treating space 611 during the substrate processing operation.

It should be understood that exemplary embodiments are disclosed herein and that other variations may be possible. Individual elements or features of a particular exemplary embodiment are not generally limited to the particular exemplary embodiment, but are interchangeable and may be used in selected exemplary embodiments, where applicable, even if not specifically illustrated or described. The modifications are not to be considered as departing from the spirit and scope of the invention, and all such modifications that would be obvious to one of ordinary skill in the art are intended to be included within the scope of the accompanying claims.

What is claimed is:

1. An apparatus for processing a substrate, the apparatus comprising:
a chamber defining a treating space in which a substrate is processed, wherein the chamber includes a first chamber body provided with a support member for supporting the substrate, and a second chamber body that is coupled with the first chamber body to define a treating space in which the substrate is processed;
a moving unit for moving any one of the first chamber body and the second chamber body;
a clamping body for clamping the chamber;
a moving module for moving the clamping body between a clamping position for clamping the chamber and an unclamping position for unclamping the chamber; and
a controller configured to control the moving unit and the moving module,
wherein the controller is configured to control the moving unit such that one of the first chamber body or the second chamber body is in contact with the clamping body when the first chamber body and the second chamber body are in a closed position for sealing the treating space, that the other of the first chamber body or the second chamber body has a gap with and is separated from the clamping body when the first chamber body and the second chamber body are in the closed position for sealing the treating space, and that the clamping body is in the clamping position.

2. The apparatus of claim 1, wherein the controller is configured to control the moving unit such that among the first chamber body and the second chamber body, the first chamber body is in contact with the clamping body when the first chamber body and the second chamber body are in the closed position for sealing the treating space.

3. The apparatus of claim 2, further comprising:
a fluid supply unit for supplying a treatment fluid to the treating space, wherein the controller is further configured to control the fluid supply unit, and configured to control the fluid supply unit to supply the treatment fluid to the treating space after the first chamber body is in contact with the clamping body.

4. The apparatus of claim 2, further comprising:
a housing having an interior space in which the chamber is disposed,
wherein the first chamber body is fastened to the housing, and
a buffer is installed between the first chamber body and the housing.

5. The apparatus of claim 4, wherein the buffer is configured such that a position of the first chamber body is not changed when the first chamber body and the second chamber body are in close contact with each other, and a position of the first chamber body is changed in a direction close to the housing when the moving unit makes the first chamber body be in contact with the clamping body.

6. The apparatus of claim 4, wherein the buffer includes a spring.

7. The apparatus of claim 4, wherein the buffer includes:
a first magnetic element installed in the housing; and
a second magnetic element installed in the first chamber body and facing the first magnetic element, and
the first magnetic element and the second magnetic element have the same polarity as each other so as to generate repulsive force between the first magnetic element and the second magnetic element.

8. The apparatus of claim 4, wherein the buffer includes:
a first magnetic element installed in the housing;
a second magnetic element installed in the first chamber body and facing the first magnetic element;
a first current source for supplying current to the first magnetic element; and
a second current source for supplying current to the second magnetic element.

9. The apparatus of claim 1, wherein the second chamber body is located below the first chamber body, and the moving unit is configured to move the second chamber body in an up and down direction.

10. The apparatus of claim 1, wherein the second chamber body is located below the first chamber body, and the moving unit is configured to move the first chamber body in an up and down direction.

11. The apparatus of claim 1, wherein at least one of the moving unit and the moving module is configured to move the chamber or the clamping body in a magnetic levitation manner.

12. The apparatus of claim 1, wherein at least one of the moving unit and the moving module is configured to include any one selected from an air cylinder, a hydraulic cylinder, and a motor.

13. The apparatus of claim 1, wherein the clamping body has one surface having a shape recessed in a direction away from the chamber such that an edge portion of the chamber in the state where the treating space is sealed is inserted.

14. The apparatus of claim 1, wherein first chamber body has a first protrusion portion, and an upper surface of the first protrusion portion is in contact with the clamping body when the first chamber body and the second chamber body are in the closed position.

15. The apparatus of claim 14, wherein the second chamber body has a second protrusion portion, and a lower surface of the first protrusion portion is separated from the clamping body when the first chamber body and the second chamber body are in the closed position.

16. The apparatus of claim 15, wherein a first sidewall of the first chamber body is separated from a neighboring second sidewall of the clamping body when the first chamber body and the second chamber body are in the closed position.

\* \* \* \* \*